US007033648B1

(12) United States Patent
Doany et al.

(10) Patent No.: US 7,033,648 B1
(45) Date of Patent: Apr. 25, 2006

(54) MEANS OF SEEDING AND METALLIZING POLYIMIDE

(75) Inventors: Fuad E. Doany, Katonah, NY (US); Jeffrey R. Marino, Fishkill, NY (US); Carlos J. Sambucetti, Croton-on-Hudson, NY (US); Ravi F. Saraf, Briarcliff Manor, NY (US)

(73) Assignee: International Business Machines Corporations, Armonk, NY (US)

( * ) Notice: Subject to any disclaimer, the term of this patent is extended or adjusted under 35 U.S.C. 154(b) by 0 days.

(21) Appl. No.: 08/781,926

(22) Filed: Dec. 30, 1996

Related U.S. Application Data

(63) Continuation of application No. 08/384,065, filed on Feb. 6, 1995, now abandoned.

(51) Int. Cl.

| | |
|---|---|
| ***H05H 1/00*** | (2006.01) |
| ***B05D 3/00*** | (2006.01) |
| ***B05D 5/12*** | (2006.01) |

(52) U.S. Cl. ...................... 427/537; 427/539; 427/555; 427/98; 427/125; 427/306; 216/65

(58) Field of Classification Search ................ 427/535, 427/539, 536, 537, 226, 307, 304, 305, 306, 427/125, 98; 216/65
See application file for complete search history.

(56) References Cited

U.S. PATENT DOCUMENTS

| | | | | | |
|---|---|---|---|---|---|
| 3,361,587 | A | * | 1/1968 | Menikheim | 427/536 |
| 3,686,018 | A | * | 8/1972 | Lindblom | 427/537 |
| 4,165,394 | A | * | 8/1979 | Ehrbar et al. | 427/537 |
| 4,780,177 | A | * | 10/1988 | Wojnarowski et al. | 427/555 |
| 4,865,873 | A | * | 9/1989 | Cole, Jr. et al. | 427/555 |
| 5,132,108 | A | * | 7/1992 | Narayanan et al. | 427/536 |
| 5,169,678 | A | * | 12/1992 | Cole et al. | 427/555 |
| 5,275,882 | A | * | 1/1994 | Conley | 427/536 |
| 5,314,709 | A | * | 5/1994 | Doany et al. | 427/555 |
| 5,576,073 | A | * | 11/1996 | Kickelhain | 427/555 |

* cited by examiner

*Primary Examiner*—Marianne Padgett
(74) *Attorney, Agent, or Firm*—Thomas A. Beck

(57) ABSTRACT

A method to selectively metallize polyimide with an all-electroless process.

11 Claims, 2 Drawing Sheets

MEANS OF SEEDING AND METALLIZING POLYIMIDE

This application is a continuation of application Ser. No. 08/384,065, filed Feb. 6, 1995, now abandoned.

TECHNICAL FIELD

The present invention relates to a method for selectively metallizing the surface of a polyimide film using an all electroless process. The deposition scheme allows enhanced adhesion between the metal, usually copper, and the polyimide substrate. Specific type resist systems are used to obtain selective plating.

PRIOR ART

The use of polymeric dielectrics such as polyimides, polysiloxanes, silicones, cyclobutadienes and other high temperature polymers like polyphenylquinoxaline in semiconductor technology especially electronic packaging applications is well known. Particularly useful among the aforementioned compositions is polyimide.

Metallization of polyimide is of great importance to various low-end and high-end packages such as, MCM-L, flex circuits, etc. However the adhesion of metal layers (or discrete lines and features) is typically poor for most methods of metallizing the polyimide without an adhesive layer. Generally, in the past, in order to get acceptable adhesion, Cr is vapor deposited or sputtered as an adhesion promoter. This practice is unattractive for two major reasons: (1) deposition processes use costly high vacuum processes having additional process steps (e.g. resist coating, lithography, resist developing, etching of excess Cr and Cu, resist stripping, etc.) in order to create circuitry; (2) the oxidation of metallic chromium to brittle chromic oxide becomes a reliability concern. Finding a resist that allows ease of application and development, as well as ease of stripping, without affecting the integrity of the underlying polyimide layer is also a problem.

U.S. Pat. No. 5,084,299 discloses a method for patterning electroless plated metal on a polymer substrate. The reference describes the use of a photoimaging patterning method thereby requiring more steps in accordance with the process to obtain the finished article than is required in accordance with the present invention. More specifically, the photoimaging method disclosed in the reference activates the entire surface of the resist on the substrate and then removes the sites on the resist where no plating is desired. The method of the present invention only activates the specific areas where plating is desired.

U.S. Pat. No. 4,981,715 discloses a method for patterning electrolessly plated metal on a substrate that is first coated with a polymer which is in turn seeded with a complexing noble metal compound to form a complexed polymer. The complex polymer is irradiated with a laser beam in the desired pattern and placed in a wet chemical etch to remove the irradiated regions. The substrate is then electrolessly plated. The present invention differs from this reference because the present invention etches prior to the seeding step, whereas the reference method seeds before the laser step.

U.S. Pat. No. 4,882,200 discloses the use of laser energy to ablate electroless plating activator material from polymer and other substrates. The reference discloses activation of the entire substrate polymer surface and ablates the areas thereon where plating is not desired.

U.S. Pat. No. 4,666,735 discloses patterning a photoimageable resin for electroless metal deposition. Because it uses a photoimaging resin, there are more steps in the process than are required in the present invention. The reference requires exposing, cleaning, etc., whereas the present invention uses laser energy to ablate the resist and then heats the resist polymer to sufficient temperature to cause it to evaporate.

SUMMARY OF THE INVENTION

The present invention relates to a method for metallizing a polyimide film, generated from a precursor polyamic acid film of a commercially available polyimide film, using an all-electroless process.

It is an object of the method of the present invention to render the surface of a polyimide used in the standard electronic packaging applications suitable for the electroless deposition of metal on to the polyimide surface thereby achieving enhanced adhesion between metal and polyimide.

In the method of the present invention, a polyimide surface is coated with an imageable resist which is exposed to a series of steps including ablation using laser energy, hydrolysis, water plasma, electroless copper plating and a heat treatment to remove the resist and anneal the copper. Contrary to the prior art, the developing process is mainly a dry process and uses a new patterning method.

DESCRIPTION OF THE FIGURES

The invention, both as to organization and the method of practice, together with further objects and advantages thereof, may best be understood by reference to the following description taken in connection with the accompanying drawings in which:

FIG. 1(*b*) depicts the laser pattern after ablation has occurred.

FIG. 1(*c*) depicts the work piece after hydrolysis showing the hydrolysate.

FIG. 1(*d*) depicts the work piece after plasma treatment showing the functionalized hydrolyzed layer.

FIG. 1(*e*) depicts the copper metal layer on the exposed film.

FIG. 1(*f*) depicts the copper layer on the substrate without coating.

FIG. 1(*g*) depicts a plurality of copper layers.

DESCRIPTION OF THE INVENTION

Figure 1A:
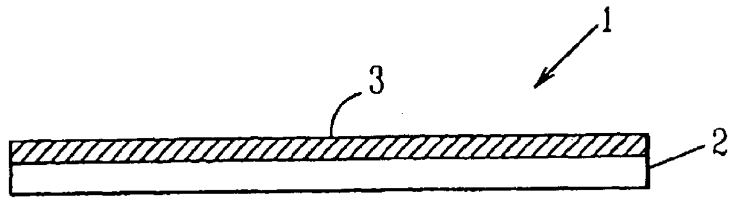
FIG. 1(*a*) depicts the coated substrate.
Figure 1B:
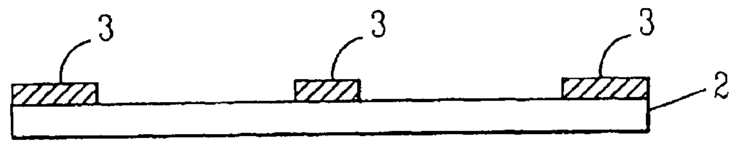
Figure 1C:
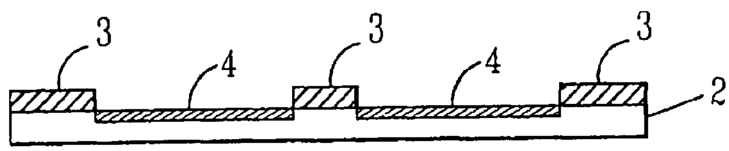
Figure 1D:
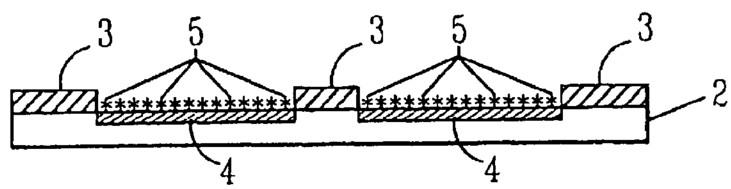
Figure 1E:
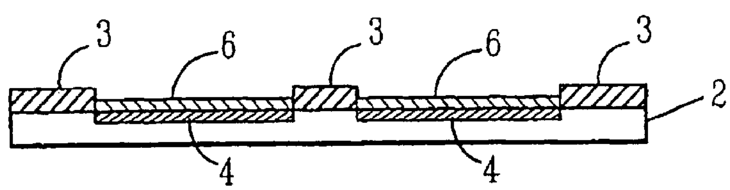
Figure 1F:
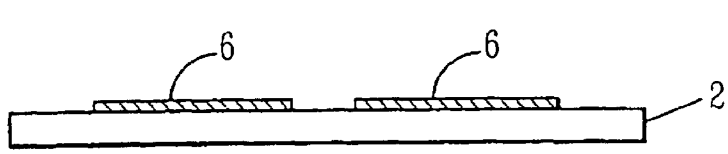
Figure 1G:
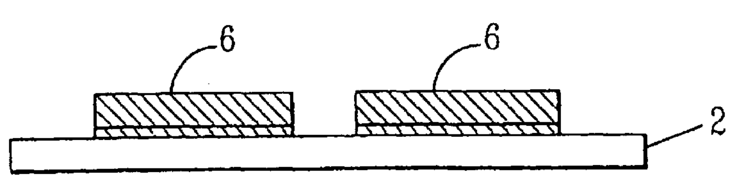

In accordance with the present invention, a polymer substrate is coated with an imagable resist material optionally containing an ultraviolet absorbing dye.

Polymers which can be satisfactorily used as substrates or dielectrics in accordance with the present invention are selected from the following group:

polyamides
polyesters
polyurethanes
polysiloxanes
phenolics
polysulfides
polyacetals
polyethylenes
polyisobutylenes polyacrylonitriles
polyvinylchlorides
polystyrenes
polyvinylacetates
polytetrafluoroethylenes
polyisoprenes
polycarbonates
polyether
polyimides
polybenzimidazoles
polybenzoxazoles
polybenzothiazoles
polyoxadiazoles
polytriazoles
polyquinoxalines
polyimidazopyrrolones and copolymers containing an aromatic constituent and a constituent selected from a vinyl and cyclobutane group wherein the aromatic constituent and the vinyl and cyclobutane groups contain at least one element selected from the group comprising Si, Ge, Ti, Zn and Fe.

The most highly preferred polymers are used in accordance with the present invention are the polyimide type polymers. Polyimide polymers are described in the Encyclopedia of Chemical Technology, Third Edition in the article entitled "Polyimides" Volume 18, p. 704, the teaching of which is incorporated herein by reference.

Generally, the polyimides include the following recurring unit where the arrows indicate isomerism:

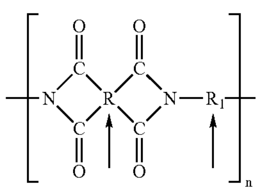

where n is an integer representing the number of repeating units to provide a molecular weight usually in the range of about 10,000 to about 100,000. R is at least one tetravalent organic radical selected from the group consisting of:

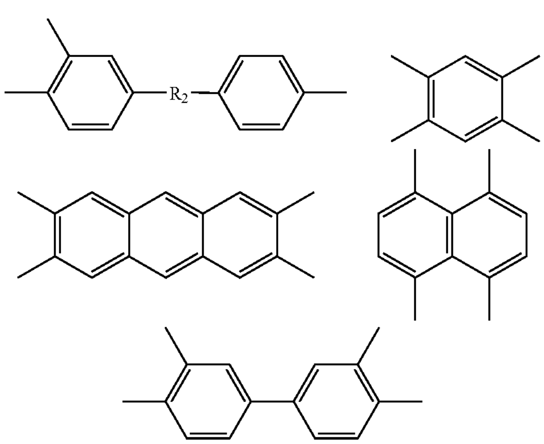

-continued

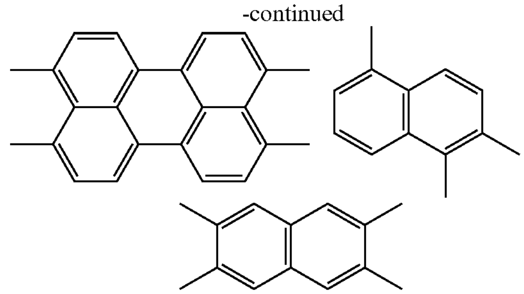

and

R2 being selected from the group consisting of divalent aliphatic hydrocarbon radicals having from 1 to 4 carbon atoms and carbonyl, oxy, sulfo, sulfide, ether, siloxane, phosphine oxide, hexafluoroisopropylidene and sulfonyl radicals and in which R1 is at least one divalent radical selected from the group consisting of an aliphatic organic radical or from the group shown:

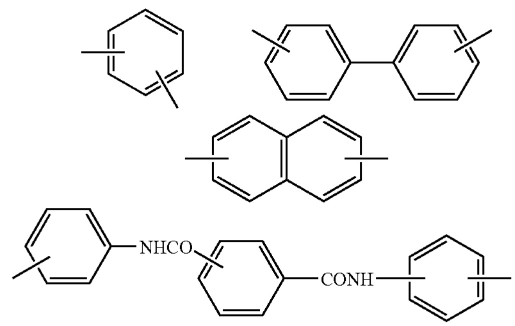

and

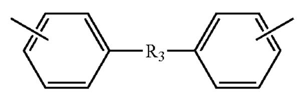

in which R3 is a divalent organic radical selected from the group consisting of R2, silicon, and amino radicals. Polymers containing two or more of the R and/or R1 radicals, especially multiple series of R1 containing amino 5 radicals, can be used.

Polyimides are available commercially from a variety of suppliers in one of three forms: (a) as solutions of the polyamic acid precursors (e.g., DuPont Pyralin); (b) as pre-imidized polyimide film (e.g., DuPont Kapton film); or (c) as pre-imidized powders (e.g., Ciba-Geigy Matrimid 5218) or solutions (e.g., Ciba-Geigy Probimide). The chemistry of commercial polyimides includes examples of many of the components listed above, but a preferred polymer for use pursuant to the present invention is based on the monomers pyromellitic dianhydride (PMDA) and oxydianiline (ODA), also named 4,4'-diaminodiphenyl ether. Other preferred polymers for use pursuant to the present invention are the polymers of benzophenonetetracarboxylic dianhydride (BTDA) and ODA and/or 1,3-phenylenediamine and polymer of 3,3-biphenylenediamine (PDA).

Polyimide films based on PMDA-ODA are available from Allied Corporation under the trade name Apical and from DuPont under the trade name Kapton. Films based on BPDA-PDA are available from UBE Corporation as Upilex and from Hitachi Chemical Company in solution form as PIO-L100. Other trade name polyimides useful pursuant to the present invention include Durimid from Rogers Corporation and the DuPont Pyralin series, including PI-2525 and PI-2566.

It is known that the direct production of high molecular weight aromatic polyimides such as PMDA-ODA, BTDA- PDA, BPDA-PDA in a one-stage polymerization cannot be accomplished because three polyimides are insoluble and infusible. The difficulty is that the polymer chains precipitate from the reaction media (regardless of whether solution or melt) before high molecular weights are obtained. These polyimides are, therefore synthesized by a two-stage process. The first stage involves an amidation reaction carried out in a polar solvent such as N, N-dimethylacetamide, N,N-dimethylformamide, dimethyl sulfoxide, or N-methyl-2-pyrrolidone to produce a high molecular weight polyamic acid.

A typical reaction is as follows:

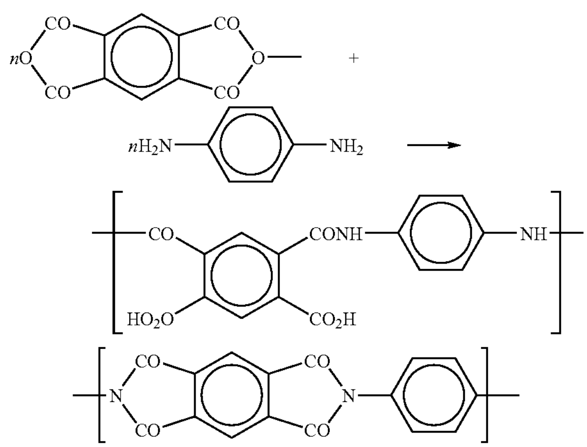

Processing of the polyimide polymers such as noted above, can only be accomplished after the first stage, at which point it is still soluble and fusible. The polymer is insoluble and infusible after the second stage of the process. The polyamic acid is formed into the desired physical form of the final polymer product (i.e. a film) and the second stage of the reaction is carried out. The polyamic acid is cyclized in the solid state to the polyimide by heating at moderately high temperatures above 150° C. The polymer is kept in a solution during the amidation reaction by using mild conditions, i.e., temperatures of 70° C. or below so as to keep the amount of cyclization to a minimum.

The amides which are of use in the present invention comprise polyether imides, polyamides, polyisoimidazole and poly isoindoloquinazolindione. It has been determined that high temperature ladder or ladder type, i.e., semi-ladder polymers such as polyimidazopyrrolones are useful.

The method of the present invention comprises the following steps: A fully cured polyimide of the types described and prepared as set forth above is coated with an imagable resist material optionally containing an ultra violet absorbing dye. A suitable resist material to be used is any water insoluble polymeric material capable of complete volatilization upon exposure to high temperature. This type of polymer is known as an "unzippable" polymer. Suitable resist polymers are poly(methylmethacrylate), poly(alpha-methylstyrene), poly(ethylene carbonate), poly(propylene carbonate), poly(ethylene-co-propylene carbonate).

Any suitable ultra-violet absorbing dye such as the type exemplified by the Tinuvin 328 dye may be incorporated into the resist.

The resist/substrate composite film is exposed to laser energy to ablate the resist from areas where Cu deposition is desired. The laser must have sufficient intensity to ablate the material used as the resist.

Optionally, the exposed polyimide surface areas are hydrolyzed by immersing the work piece in an alkali metal hydroxide solution. Better results are generally obtained if this step uses NaOH or KOH as the hydrolysing agent.

The composite film is then exposed to water plasma to functionalize (additionally, if the hydroxide step is utilized) the exposed polyimide surface. The plasma is used to form —OH —COOH groups on the surface of the polyimide. The use of a water vapor plasma to obtain improved interfacial metal to polyimide adhesion has been reported in *Polymer Surface Modification in Water Vapor*, R. D. Goldblatt et al., (1989) the contents of which are hereby incorporated by reference herein.

The functionalized surface is then immediately seeded preferably with Pd using an appropriate Pd salt solution as described by R. F. Saraf, et al. *IBM Journal of Research and Development*, V38, page 441 (1994). In addition, Pt, Ni or Rh can also be used effectively. Preferred salts are palladium chloride, palladium acetate and palladium nitrate.

The seeded film is then immersed in an electroless bath to deposit the Cu metal on the exposed polyimide film.

The Cu strike layer is heat treated to anneal any strains present in the Cu layer, and simultaneously the heat is maintained for such time and at a sufficiently high temperature to volatilize the resist, thereby forming a selectively deposited Cu feature. The unzippable polymer goes off as a vapor so there is no residual cover on the polyimide after the heat treatment. With this step, the mask is eliminated without any need for separate steps.

Alternatively, a non-unzippable polymer-resist can be used as a resist that is (a) laser developable and (b) soluble in a solvent that does not attack the rest of the structure. An example of this is a resist based upon polystyrene containing an ultraviolet dye applied onto a polyimide substrate. In this case, the resist is removed by solvent rather than by the heat which volatilizes the resist.

A third case that can be utilized in accordance with the present invention is one in which the resist is transparent and not laser developable and possesses a thickness of up to one-half micron. Because the polymer substrate is laser ablatable, its removal insures the removal of the resist directly over it. The excess resist can be removed by either solvent or heat depending on the properties of the polymer.

Additional metal layers can be further built up by repeating the sequence of steps detailed above.

DETAILED DESCRIPTION OF THE PREFERRED EMBODIMENT OF THE INVENTION

The preferred embodiment of the invention can be illustrated by means of the following example.

EXAMPLE 1

Samples of an imide polymer designated Polyimide 2525 having a thickness of 0.001 (1 micron) cm were dried at low temperature to 69 weight percent solids at 94% amic acid. Each polyimide substrate (2) was coated with a layer (3) (between 1 and 10 microns of a blend of poly (methymethacrylate) and Tinuvin 328 ultra violet absorbing dye. FIG. 1(*a*) shows the resist coated polyimide product (1).

The composite film (1) (resist/polyimide) was subjected to a 308 nm laser through a mask atop the polyimide. The poly(methymethacrylate) resist (3) was removed from areas where Cu deposition was desired. FIG. 1(*b*) shows the laser pattern after laser ablation has occurred.

According to the preferred embodiment, the exposed polyimide surface was exposed a 0.4M sodium hydroxide solution by immersing the work piece into the solution. FIG.

1(*c*) depicts the work piece after hydrolysis has occurred and shows the layer of hydrolysate reaction product (4) in place on the polyimide.

The film was then exposed to water plasma to functionalize the exposed polyimide surface and was promptly seeded with an aqueous palladium nitrate solution having a 1 mg/ml concentration for about 45 seconds. The seeded product was rinsed in flowing water for about 60 seconds. FIG. 1(*d*) depicts the work piece after plasma treatment and shows the functionalized hydrolyzed layer (5).

The seeded film was then immersed in a standard room temperature electroless copper bath for 2 minutes and then rinsed. FIG. 1(*e*) depicts the copper metal layer (6) that was deposited on the exposed treated polyimide film. Other suitable metals to be used as the electroless metal bath are Ni, a cobalt-phosphorus alloy rotated Co(P), and Au.

The work piece was then heated in nitrogen to a temperature of 250° C. for one hour to volatilize the poly (methylmethacrylate) which vaporized leaving only the copper layer (6) on polyimide substrate (2) as depicted in FIG. 1(*f*).

The metal layer is further built up by additional electroless Cu deposition.

It was noted during the process that the poly (methylmethacrylate) was not functionalized. Consequently, it was noted that that layer did not seed, and therefore, no electroless deposition occurred in the step shown in FIG. 1(*e*).

EXAMPLE 2

The process described in Example 1 was duplicated with the exception that poly(alpha-methylstyrene) was substituted for the poly(methylmethacrylate). The resultant product has the same beneficial properties as the product prepared in Example 1.

Figure 2:
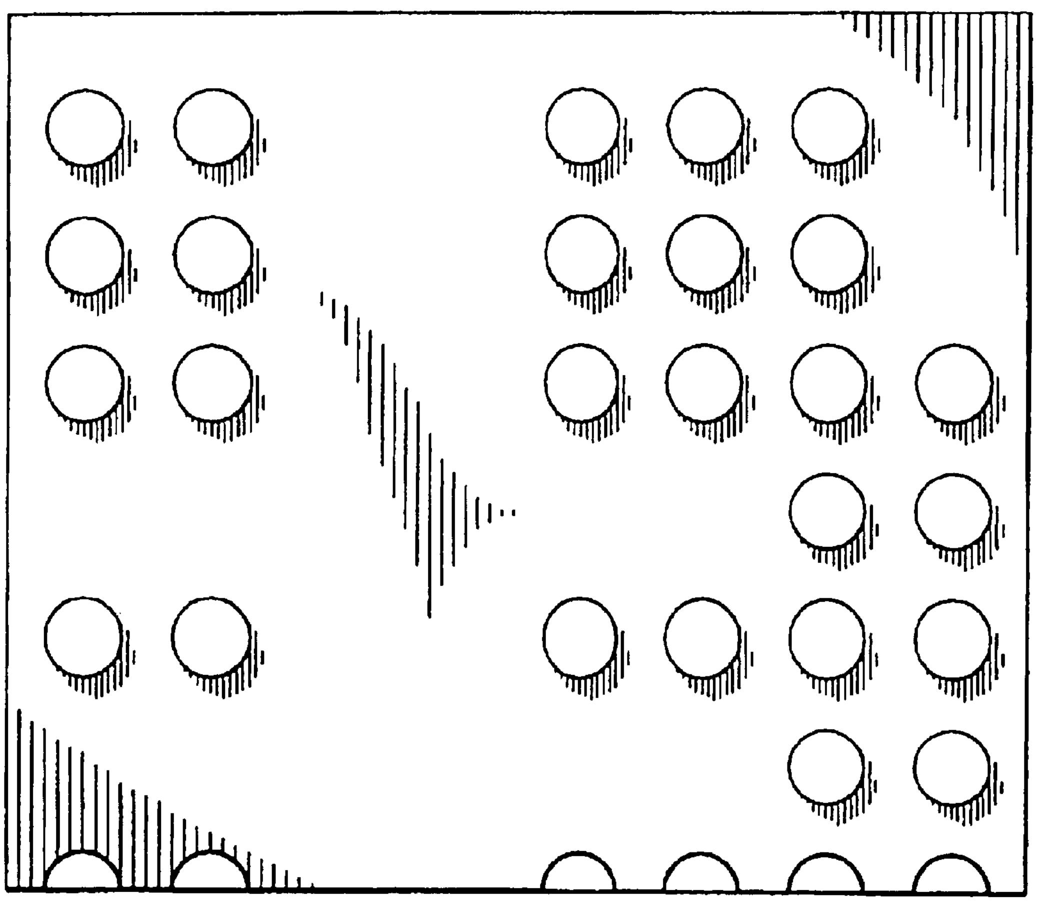
FIG. 2 is a close up of the electrical interconnect showing 100 micron copper features patterned in accordance

The process disclosed above has been implemented successfully with readily available materials in a bench top environment and is readily adaptable to manufacturing scale batch processing. FIG. 2 shows an optical micrograph of a pattern built using the method described above.

While the invention has been particularly shown and described with respect to the preferred embodiments set forth above, it will be understood by those skilled in the art that the foregoing and other changes in form and details may be made therein without departing from the spirit and scope of the invention.

What is claimed is:

1. The method of metallizing a polymer substrate surface using an electroless process comprising:

(a) forming a composite film by coating a polymeric substrate selected from the group consisting of polyimides, polyetherimides, polyamides, polyisoimidazole, polyisoindoloquinazolindione and polyimidazopyrrolones with a water insoluble imageable resist polymer selected from the group consisting of poly(methymethacrylate), poly(alpha-methylstryrene), poly(ethylene carbonate), poly (propylene carbonate) and poly(ethylene-co-propylene carbonate) capable of being totally volatilized upon to a volatilizing temperature, wherein the composite film consists essentially of said polymeric substrate and said resist;

(b) patterning by exposing said imageable resist polymer composite film using laser energy with a wavelength of between about 230 nm and 360 nm sufficient to ablate said imageable resist polymer at a location where subsequent electroless metal deposition is desired, thereby exposing said polymeric substrate and thereby forming an ablated composite film;

(c) immersing said imageable resist polymer composite film into an alkaline solution selected from the group consisting of sodium hydroxide and potassium hydroxide then exposing said ablated composite film to water vapor plasma forming reactive $OH^-$ and —COOH ions to provide reactive $OH^-$ and —COOH groups on the surface of said exposed polymeric substrate by reacting said plasma ions from said water plasma with said exposed polymeric substrate;

(d) seeding said exposed surface of said polymeric substrate surface with a catalytically active metal salt selected from the group consisting of palladium, platinum, nickel or rhodium which is capable of forming a bond with said polymeric substrate;

(e) contacting said seeded polymeric substrate surface with an electroless metal bath which contains a metal selected from the group consisting of copper, nickel, gold and cobalt-phosphorus to deposit said from said bath thereon; and (f) heating said composite film treated as defined above for such time and at such temperature to anneal said electrolessly deposited metal and to volatilize completely the remaining resist polymer.

2. The method defined in claim 1 wherein said resist polymer contains an ultra-violet absorbing dye.

3. The method defined in claim 2 wherein said resist an unzippable polymer.

4. The method defined in claim 1 wherein said salt is palladium chloride, palladium nitrate and palladium acetate.

5. The method defined in claim 1 wherein said unzippable polymer evaporates so that there is no residual cover on said polymer substrate after said heat treatment.

6. The method defined in claim 1 wherein a non-unzippable polymer is used to cover said substrate, said resist polymer is laser developable ablatable and soluble in a solvent that does not attack said substrate.

7. The method defined in claim 6 wherein said polymer is polystyrene containing an ultraviolet absorbing dye.

8. The method defined in claim 1 wherein said resist polymer is transparent, is non laser developable and is present atop said substrate in a thickness up to about one-half micron, whereupon after the desired area of said substrate is ablated along with said resist polymer situated thereupon, the remaining said resist polymer is removed by application of heat or by contact with a solvent.

9. The method defined in claim 5 wherein multi-layer circuits are prepared.

10. The method defined in claim 8 wherein multi-layer circuits are prepared.

11. The method defined in claim 1, wherein said resist polymer which is coating said polymeric substrate is up about one-half micron in thickness and is transparent to light suitable for ablating said substrate, said resist polymer being laser patterned when exposed to radiation that also ablates said substrate.

* * * * *